(12) United States Patent
Chang et al.

(10) Patent No.: US 12,745,672 B2
(45) Date of Patent: Sep. 22, 2026

(54) SEMICONDUCTOR STRUCTURE WITH INTEGRATED PASSIVE DEVICE HAVING OPPOSED SOLDER BUMPS

(71) Applicant: Taiwan Semiconductor Manufacturing Company, Ltd., Hsinchu (TW)

(72) Inventors: Fong-yuan Chang, Hsinchu County (TW); Ho Che Yu, Zhubei City (TW); Yu-Hao Chen, Hsinchu City (TW); Yii-Chian Lu, Taipei (TW); Ching-Yi Lin, Zhubei City (TW); Jyh Chwen Frank Lee, Palo Alto, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 890 days.

(21) Appl. No.: 17/824,330

(22) Filed: May 25, 2022

(65) Prior Publication Data

US 2023/0387078 A1 Nov. 30, 2023

(51) Int. Cl.

| | |
|---|---|
| ***H01L 25/065*** | (2023.01) |
| ***H01L 23/00*** | (2006.01) |
| ***H01L 25/00*** | (2006.01) |
| ***H10W 72/00*** | (2026.01) |
| ***H10W 90/00*** | (2026.01) |
| ***H10W 90/20*** | (2026.01) |
| ***H10W 90/28*** | (2026.01) |

(52) U.S. Cl.

CPC .......... *H10W 90/00* (2026.01); *H10W 72/823* (2026.01); *H10W 90/28* (2026.01); *H10W 90/288* (2026.01); *H10W 90/724* (2026.01)

(58) Field of Classification Search

CPC . H01L 25/0657; H01L 25/162; H01L 23/642; H01L 24/16; H01L 25/50; H01L 2225/06517; H01L 2225/06548; H01L 2924/19106; H10D 1/00–716; H10W 90/00; H10W 72/823; H10W 90/28; H10W 90/288; H10W 90/724; H10W 72/20; H10W 70/611; H10W 70/65; H10W 70/685; H10W 90/401; H10W 90/701

See application file for complete search history.

(56) References Cited

U.S. PATENT DOCUMENTS

| | | | | |
|---|---|---|---|---|
| 12,300,679 | B2 * | 5/2025 | Lee | H01G 4/242 |
| 2004/0227258 | A1 * | 11/2004 | Nakatani | H01L 23/5389<br>257/E25.023 |
| 2017/0243826 | A1 * | 8/2017 | Lin | H01L 25/0657 |
| 2018/0350747 | A1 * | 12/2018 | Hwang | H01L 23/5389 |
| 2021/0280507 | A1 * | 9/2021 | Aldrete | H01L 23/3128 |

* cited by examiner

*Primary Examiner* — Jessica S Manno
*Assistant Examiner* — Ricky Verdes
(74) *Attorney, Agent, or Firm* — Foley & Lardner LLP

(57) ABSTRACT

A semiconductor device includes an integrated passive device coupled to a redistribution structure by a plurality of first bumps, and having a plurality of second bumps disposed opposite the plurality of first bumps, wherein the plurality of first and second bumps are thermally and/or electrically connected, and thus enable further thermal and/or electrical connections within or comprising the semiconductor device.

20 Claims, 9 Drawing Sheets

SEMICONDUCTOR STRUCTURE WITH INTEGRATED PASSIVE DEVICE HAVING OPPOSED SOLDER BUMPS

BACKGROUND

Semiconductor devices are ubiquitous in several applications and devices throughout various industries. For example, consumer electronics devices such as personal computers, cellular telephones, and wearable devices may contain several semiconductor devices. Similarly, industrial products such as instruments, vehicles, and automation systems frequently comprise a large number of semiconductor devices. As semiconductor manufacturing improves, semiconductors continue to be used in new applications which, in turn, leads to increasing demands of semiconductor performance, cost, reliability, etc.

These semiconductor devices are fabricated by a combination of front end of line ("FEOL") processes, which manufacture semiconductor (e.g., silicon) dies, and back end of line ("BEOL") processes, which package one or more of these dies into a semiconductor device that can interface with other devices. For example, the package may combine a plurality of semiconductor dies and can be configured to be attached to a printed circuit board or other interconnected substrate, which may, in turn, increase the thermal density of a semiconductor device.

Physical demands for device miniaturization and increasing connectedness are driving increases to semiconductor device density. Modern packaging technologies (e.g., package on package (PoP), Fan-Out packaging (FO), etc.) are driving miniaturization, intercommunication, and other improvements. The thermal consequences of some of this increase in density can be mitigated by various process improvements including die miniaturization, materials selection, low voltage operation, etc. While such approaches use sophisticated techniques, further improvements are needed to advance the state of the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
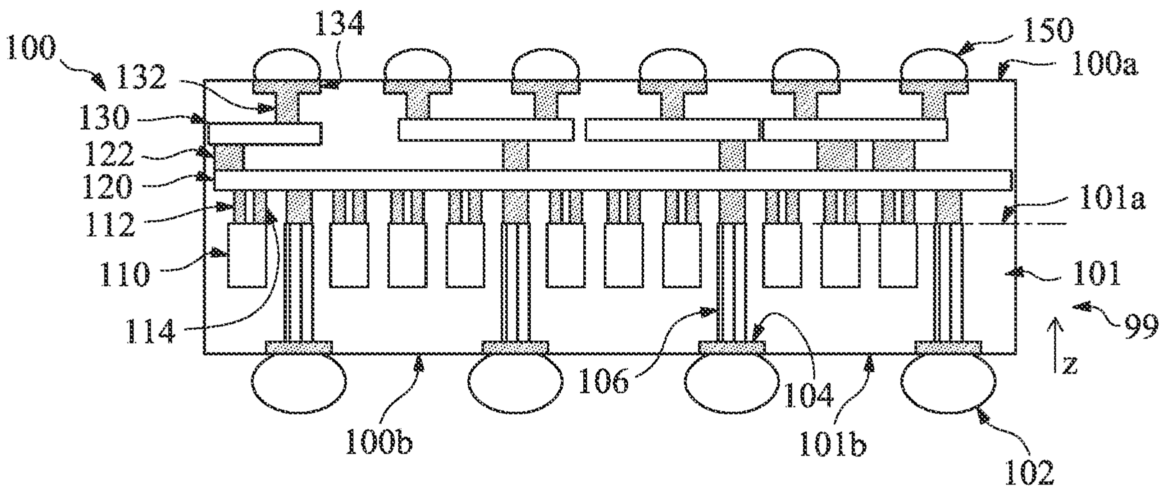
FIGS. 1A, 1B, 1C, and 1D illustrate cross sectional views of a DTC IPD, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated passive device (IPD) may be included in a semiconductor device instead of or in addition to various in-silicon/metallization features. For example, an IPD may contribute a relatively large capacitance or inductance to a semiconductor device (e.g., for voltage regulation purposes, filters, etc.). Increasingly complex and dense semiconductor device packages may benefit from the inclusion of such IPD's, as they continue to require ever tighter voltage regulation and isolation (e.g., isolation of analog circuits such as RF from digital circuits, between high speed signals such as clocks and various transceivers, etc.). Inclusion of the IPD near a substrate (e.g., a printed circuit board (PCB)) the semiconductor is coupled to may minimize the z-height of the semiconductor device, and minimize the distance of data signal or power delivery networks (PDNs) transmission. This can be particularly beneficial when the signal or power is passed between the substrate (e.g., a PCB) and the semiconductor device, such as a PDN providing a supply voltage to a semiconductor device, or a high speed transceiver communicatively coupling to the semiconductor device through the PCB.

Including an IPD in a semiconductor device, or between a semiconductor device and a substrate, may displace other connectivity between the substrate and the semiconductor device. For example, a thermal pad may become smaller, various I/O between the semiconductor device and the substrate may be reduced, terminal pitch may be reduced, or the semiconductor device may be enlarged which may be undesirable in some applications. However, the IPD may be configured to provide additional connectivity between the substrate and the semiconductor device. For example, the IPD may provide at least one of thermal connectivity or electrical connectivity. The IPD may be coupled to a semiconductor device through solder bumps on a first side, and connected to a PCB by additional solder bumps on a second side, opposite the first side. In some embodiments, the solder bumps may be electrically isolated, but thermally connected, so as to allow heat to flow from the semiconductor device into the PCB (or vice versa). In other embodiments, at least some of the solder bumps on the first side may be electrically connected to at least some of the solder bumps on the second side. For example, the solder bumps may pass one or more signals between the substrate and the semiconductor device (e.g., PCB VSS to semiconductor device VSS).

In some embodiments, signals may be selected to pass through the IPD, according to various criteria. For example, electrically noisy signals may be selected based on a proximity to VSS, which may result in improvements in signal integrity of other signals. Alternatively or in addition, signals may be selected based on a resilience to aggressor signals (e.g., where a noisy VCC also passes through the IPD, and may couple with other signals). Further, signals may be selected according to a location of interest on the semiconductor device (e.g., if a transceiver is included on a semiconductor die of a semiconductor device near the location of the IPD, the transceiver signal may be passed through the IPD). Further, passing signals through the IPD may enable signals to be conditioned, such as by the use of filters. As a result, the semiconductor device having an IPD with opposed solder bumps may simultaneously improve the PDN performance of a semiconductor device and improve thermal performance of the semiconductor device. Such improvements to the PDN may make PDN connections from other terminals of the semiconductor device redundant (e.g., BGA balls, PGA pins, leads, etc.). Eliminating these terminals may enable smaller packages, simplified or eliminated fan-out structures, etc. Alternatively or in addition, those terminals can be repurposed to enable additional I/O, power delivery, etc.

An IPD comprises passive devices (e.g., resistors, inductors, transformers, diodes, etc.). For example, an IPD may comprise metal windings or other patterns, a silicon chip (which is also referred to as a die herein), signal or power filters, fuses, etc. The figures hereinafter refer to a deep trench capacitor (DTC) IPD, comprising both silicon and patterned metal elements, and is illustrative many other IPD types. Thus the repeated references to the DTC IPD should not be construed as limiting. One skilled in the art will understand that many other IPDs may be substituted for those explicitly disclosed herein. For example, some IPDs may not comprise a silicon chip, or a redistribution structure. Moreover, some IPDs may contain terminals other that the bumps hereinafter described. For example, an IPD may comprise a ground pad along a surface.

FIGS. 1A-1D illustrate various cross sectional views of a DTC IPD 100, in accordance with some embodiments. As depicted in FIG. 1*a*, the DTC IPD 100 comprises a silicon chip 101 having an active surface 101*a* along an upper surface of the DTC IPD 100, with respect to the z-axis 99. The active surface of the silicon chip 101 comprises a first electrode layer, a dielectric layer, and a second electrode layer. The first electrode later is an anode layer. The second electrode layer is a cathode layer. The dielectric layer is disposed between the two electrodes along a surface of the active surface 101*a*. The active surface of the semiconductor is configured to maximize surface area (e.g., is non-planar, with narrow, deep trenches); one or more of these trenches is referred to as a DTC 110.

Each DTC 110 is connected to a DTC ground terminal 112, connecting to the first electrode layer (i.e., the anode), and a DTC supply terminal 114, connecting to the second electrode layer (i.e., the cathode). A plurality of DTCs 110 are formed along the active surface 101*a*. At least some of the plurality of DTC supply terminals 114 are connected at least one of a plurality of first IPD bumps 150, or a plurality of second IPD bumps 102, which are disposed along a first surface 100*a* and second surface 100*b* of the DTC IPD 100, respectively. Likewise, at least some of the plurality of DTC ground terminals 112 are connected at least one first IPD bump 150 and at least one second IPD bump 102, which may allow a supply or ground current to pass through the IPD 100.

In the depicted embodiment, the second IPD bumps 102 are connected to the active surface 101*a* through the silicon chip 101 by a plurality of through silicon vias 106 (TSVs). The TSVs 106 comprise a conductive core such as copper. They may be formed by forming vias though the semiconductor chip 101, (e.g., deep reactive ion etching (DRIE), laser drilling, or another etching process). Some embodiments may form the vias through two surfaces of the semiconductor chip 101. Some embodiments may form the via through only one surface (e.g., a blind via), in which case, a back-thinning process may thereafter be used to expose the via along an additional surface, which may be performed at various processing operations, such as prior to or subsequent to filling the via with a conductive material. A surface of the vias may, in some embodiments, be overlaid with an insulating layer comprising one or more layers of silicon dioxide (SiO2), silicon nitride (Si3N4), silicon oxy-nitride (SiON), or another insulating material which may be deposited by deposition process such as physical vapor deposition (PVD) or chemical vapor deposition (CVD). The vias are then filled with a conductive core. In some embodiments, filling the vias may result in residual material (e.g., copper or aluminum) along a surface of the semiconductor chip 101. In such embodiments, a planarization process such as chemical mechanical planarization may be used to remove the excess copper (e.g., to leave a planarized surface of copper, or SiO2, etc. along a surface of the semiconductor chip). In some embodiments, the TSVs 106 may be connected to the second IPD bumps 102 by one or more intermediate structures, such as one or more lower IPD terminals 104 disposed along a second surface 101*b* of the silicon chip 101, opposite the active surface 101*a*.

The first IPD bumps 150 are disposed opposite the second IPD bumps 102, and connect to the active surface 101*a* of the semiconductor chip in the depicted embodiment. As depicted by FIG. 1*a*, these connections are made through an IPD redistribution structure comprising a plurality of first vias 112 electrically connected to an active surface 101*a* of the semiconductor chip 101 and to a layer of first conductive elements 120. A plurality of second vias 122 connects the layer of first conductive elements 120 to a layer of second conductive elements 130, which, in turn connects to the plurality of first bumps 150 through intermediate vias 132 and upper IPD terminals 134 disposed along an upper surface 100*a* of the DTC IPD 100. An isolating layer 218 (e.g., resin, polymer, oxide, etc.) electrically isolates the first conductive elements 120 from the second conductive elements 130, and contains openings for vias which, as mentioned above, selectively connect various layers of the DTC IPD 100. Other embodiments may have additional or fewer layers of conductive elements. For example, some embodiments have zero, one, or three such layers. Embodiments which have a plurality of layers may have layers of differing material. For example, one three-layered embodiment comprises two copper layers, and one aluminum layer.

Figure 1B:
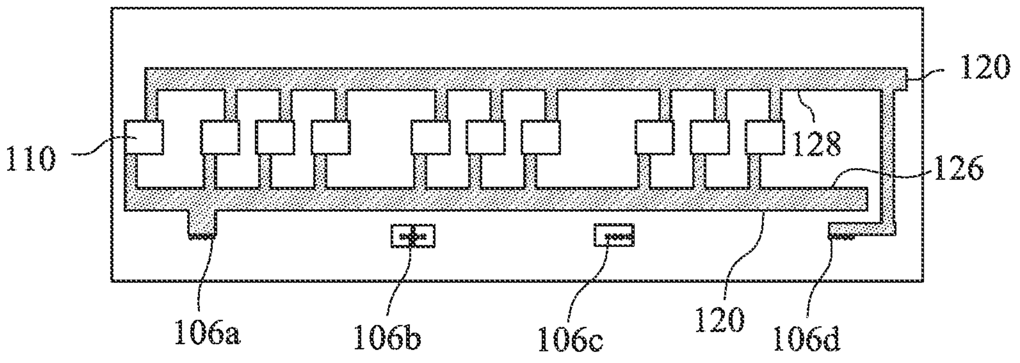

Turning to FIG. 1B, a top down view of the DTC IPD 100 (i.e., from the positive z-axis 99) of FIG. 1*a* is disclosed; selected elements of planes disposed along the active surface 101*a*, and the layer of the first conductive elements 120 are depicted therein. The DTCs 110 of the DTC IPD 100 are shown connected to first conductive elements 120 comprising a ground bus 126 and a supply bus 128. The depicted embodiment further discloses a plurality of first TSVs 106*a* are connected to the ground bus 126, and to a second IPD bump 102. Although limited contact area between the TSVs is depicted to better illustrate the first TSVs 106*a*, in other embodiments, the full perimeter of the first TSVs 106*a* may be in contact with the ground bus 126. In some embodiments, ground connections between the first 150 and second IPD bumps 102 may not be made. For example, certain semiconductor devices employing RF circuits or requiring isolation (e.g., AC coupled devices) may not comprise a ground connection, a supply connection, etc. Although four TSVs are depicted connecting to each second bump through the lower IPD terminals 104, some embodiments may employ a different number of TSV. For example, a plurality of rows or columns of TSV could connect to each bump. Further, A TSV density (e.g., of the TSV area, or the conductive TSV areas) with regard to the silicon chip 101 may be based on the diameter and density of the TSVs. Some embodiments of the IPD may have such density exceeding 3%, for example, they may be about 5%, about 7%, or about 10%. Such embodiments may have lower thermal and electrical resistance than embodiments which have less metal, and more non-metal (e.g., SiO2).

A plurality of second TSVs 106*b* is shown connecting to a layer of first conductive elements 120. The second TSVs 106*b* and conductive elements may be configured to pass a signal such a pair of differential signals, a digital signal, an analog signal, etc. Similarly, a plurality of third TSVs 106*c* are depicted passing an additional signal. A fourth plurality of TSVs 106*d* is shown connected to the supply bus 128. In some alternate embodiments, all bumps connect to DTCs 110.

Figure 1C:
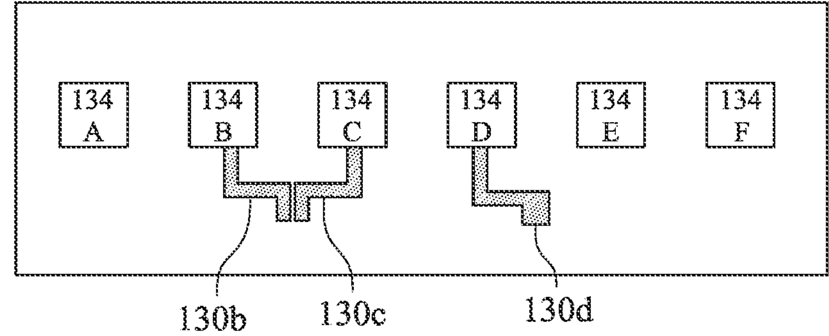

Turning to FIG. 1*c*, an additional top down view of the DTC IPD 100 is disclosed; selected elements of the first surface 100*a* and the layer of the second conductive elements 130 of the DTC IPD 100 are disclosed. A plurality of upper IPD terminals 134 which are configured to connect to first IPD bumps 150 are disposed along the first IPD surface 100*a*. For example, the upper IPD terminals may be overlaid over the first IPD surface 100*a* or disposed within openings so in an upper insulating layer comprising the first IPD surface 100*a*. A first upper IPD terminal 134*a* may connect to a second IPD bump through the power bus or other intermediate connections. In the depicted embodiment, these connections are not shown because they are immediately under the depicted first upper IPD terminal 134*a*. Other embodiments may comprise larger conductive elements. For example, in some embodiments, a majority of the layer of second conductive elements 130 may be conductive supply elements (i.e., a power plane) which may, advantageously, improve PDN performance and shield other signals, or may form various structures connected to the supply voltage (e.g., resistors, inductors, etc.) which may, advantageously, improve PDN, filter signals, etc. Connections to upper IPD terminals 134*e-f* are not depicted for similar reasons, but may, in some embodiments, comprise connections to ground planes, guard traces, various circuits, etc. Depicted connections include the connection of the signals of the second TSVs 106*b* to the second and third upper IPD terminals 134*b-c*, and the third TSVs 106*c* to the fourth upper IPD terminal 134*d*.

Figure 1D:
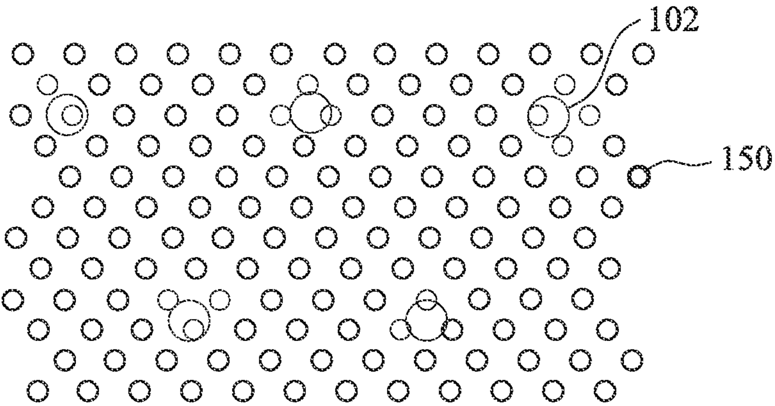

It should be noted that although the depicted embodiments contain a single row of first IPD bumps 150 and second IPD bumps 102, that this depiction is not intended to be limiting. Indeed, many embodiments may comprise multiple rows of bumps forming columns (e.g., a grid), and may offset alternating rows or columns to form an offset grid, which may increase the density of bumps while maintaining a minimum spacing between bumps. One skilled in the art will understand that various IPDs comprise many patterns of bumps, pads, etc. to adhere an IPD to various substrates, redistribution structures, semiconductor chips, etc. FIG. 1*d* depicts a projection of one illustrative pattern of first IPD bumps 150 and second IPD bumps 102, wherein at least some of the first IPD bumps 150 overlap the second IPD bumps 102. As depicted, the first bumps 150 are of a smaller size (e.g., diameter), and the second bumps are of a lower density. Other embodiments may employ bumps of various size, shape, density, material, etc.

Figure 2:
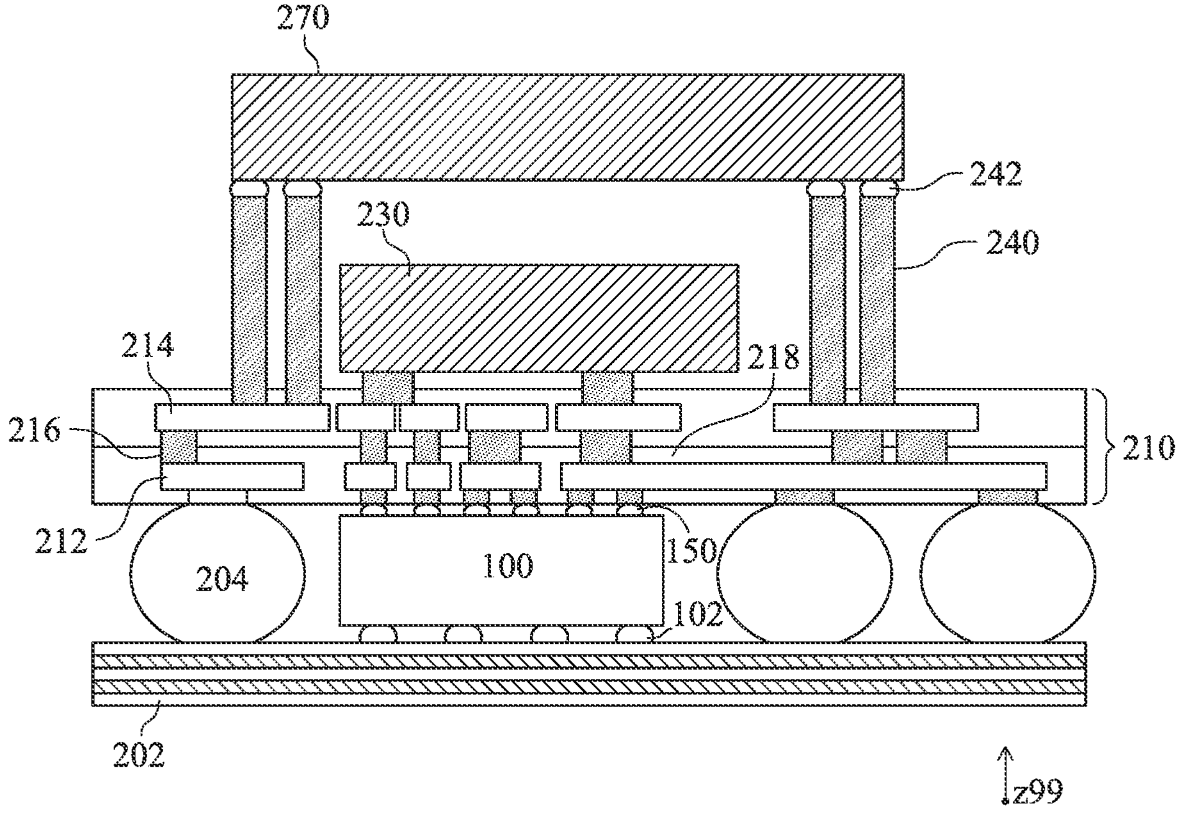
FIG. 2 illustrates a cross sectional view of a semiconductor device, in accordance with some embodiments.

FIG. 2 illustrates a cross sectional view of a semiconductor device, in accordance with some embodiments. An IPD 100 is disposed between a substrate 202 and a redistribution structure 210. The IPD is electrically and mechanically connected to the redistribution structure 210 by a plurality of first IPD bumps 150, and is electrically and mechanically connected to the substrate 202 by a plurality of second IPD bumps 102. A plurality of third bumps 204 are also disposed between the substrate 202 and the redistribution structure 210. These third bumps 204 are laterally spaced from the IPD 100 and may also be configured to electrically and mechanically attach to each of the substrate 202 and the redistribution structure 210. For example, the third bumps may be BGA balls and may be configured to attach to solder mask defined (SMD) or non-solder mask defined pads of the substrate (e.g., PCB or intermediate package substrate), and to an under-ball metallurgy pattern (UBM) or other terminal of the redistribution structure 210. In other embodiments, the third bumps may comprise another conductive terminal such as gull-wing leads, a lead frame, terminal pins, etc.

The IPD 100 may comprise various inductors, resistors, capacitors, etc., which, in combination with further elements of the PDN of the semiconductor device, condition one or more supply voltages or grounds to the semiconductor device. The depicted redistribution structure comprises a layer of first conductive elements 212 and a layer of second conductive elements 214, with an isolating layer 218 of insulating material between, which electrically isolates the conductive elements. The insulating material may comprise a polymer such as polybenzoxazole (PBO), polyimide, BCB, or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like. The isolating layer may comprise a plurality of vias 216 formed in openings of the insulating material, which provide connections between the first 212 and second 214 conductive elements. For example, the vias may form electrical, mechanical, and/or thermal connections.

The semiconductor device also comprises a semiconductor chip 230 which is disposed along an upper surface of the redistribution structure 210 opposite the IPD 100. A layer of additional isolating material is shown disposed between the second conductive elements 214 and the semiconductor chip 230. Vias are depicted which connect the second conductive elements 214 to the semiconductor chip 230. These vias may carry supply and ground voltages to various terminal pins of the semiconductor chip 230. In some embodiments, the terminal pins may independently connect to the second conductive elements 214. Alternatively, a plurality of terminal pins may be bridged by metallization layers, vias, etc., thus consolidating the number of connections and simplifying the redistribution layer. Alternatively or in addition, vias may carry various data, clock, or other signals to the semiconductor chip 230. The PDN or other signals may be sourced from or connected to the substrate 202 (e.g., through the IPD, through the third bumps, etc).

A plurality of through via structure (sometimes referred to as a Through-Interlayer-Via or Through-InFO-Via (TIV)) 240, traverse through the semiconductor device along the z-axis 99. Like the vias connecting the semiconductor chip 230 to the second conductive elements 214, the TIVs 240 may carry various PDN and non-PDN signals. For example, a memory device 270 (e.g., DRAM, SRAM, FLASH, HBM) disposed along an upper surface of the TIVs 240 (e.g., connected to the TIVs by a conductive terminal 242, such as a solder bump) may require one or more grounds or supply voltages, and various I/O. These signals may be passed by the TIVs 240. For example, the TIVs 240 may connect data, address, and clock signals between the semiconductor chip 230 and the memory device 270.

The semiconductor chip 230, the memory device 270, various vias, and conductive elements of the semiconductor device may use large amounts of power, and thus generate large amounts of heat. For example, the semiconductor chip 230 may be a high power processor chip, the memory device 270 may be a DRAM device, and the various conductive elements and vias of the semiconductor device may generate heat as transmission losses from various PDN and non-PDN signals. Such a semiconductor device may use tens or hundreds of watts of power, and thus generate tens or hundreds of watts of heat. In some embodiments, heat may be dissipated through various junctions such as an air to package junction of at least a portion of the semiconductor device, a heatsink to package junction of another portion of the semiconductor device, etc. The IPD 100 may represent an additional junction capable of sinking heat from the semiconductor device into the substrate 202. Thus the design of the IPD may be optimized to minimize thermal resistance between the first IPD bumps 150 and the second IPD bumps 102.

The composition of the opposed IPD bumps may be optimized to maximize thermal performance both by the selection of thermally conductive materials to pass heat, as well as the selection of electrically conductive materials, in order to minimize additional heat generated by their resistance (e.g., to supply and ground currents) between the IPD 100 and the substrate 202 and/or the redistribution structure 210. For example, copper, aluminum, silver, graphene, tin, and various alloys or other combination thereof may be selected. Further, the geometry of the IPD may be defined according to optimizing thermal dissipation. For example, the first IPD bumps 150 and the second IPD bumps 102 may be placed to minimize lateral (i.e., along a plane perpendicular to the z-Axis) heat flow through the IPD 100. In one embodiment, at least a portion of the first IPD bumps 150 overlaps with a portion of the second IPD bumps 102 along the z-axis 99. Similarly, at least a portion of the IPD 100 may overlap with the semiconductor chip 230, minimizing the z-distance heat must travel. For example, the IPD 100 and the silicon chip 230 may entirely overlap along the z-axis 99, or a first portion of the IPD 100 may overlap with a portion of the semiconductor chip 230 and a second portion of the IPD 100 may overlap with a TIV 240 (e.g., to minimize the lateral flow of ground and supply currents which are passed from the substrate 202, through the IPD 100, to the memory device 270.)

Further, because many IPDs comprises inductors, capacitors, or resistors, one skilled in the art will understand that the properties of such device may be designed to minimize thermal heat, and maximize thermal conductively. For example, high value capacitors may minimize generated heat by minimizing ripple currents, and the increased electrode size may decrease thermal resistance through the IPD (e.g., aluminum or copper electrodes can displace $SiO_2$ within the IPD to reduce thermal resistance, even where the larger electrodes are not electrically required). For similar reasons, low resistance inductors may simultaneously lower generated heat, and increase thermal conductivity.

The redistribution structure 210 may also be optimized to transmit heat. For example, conductive elements may have a minimized z-height for passing heat and current along the z-axis, or a maximized z-height for passing heat and current laterally. Some embodiments comprise a plurality of redistribution layers having a plurality of thicknesses (i.e., z-heights). Further, large planes (e.g., ground planes and power planes) may simultaneously minimize electrical resistance and maximize thermal conductivity. For IPDs comprising further redistribution structures, similar approaches may be employed. Moreover, an under fill may be selected according to its thermal properties, to further minimize thermal resistance.

Figure 3:
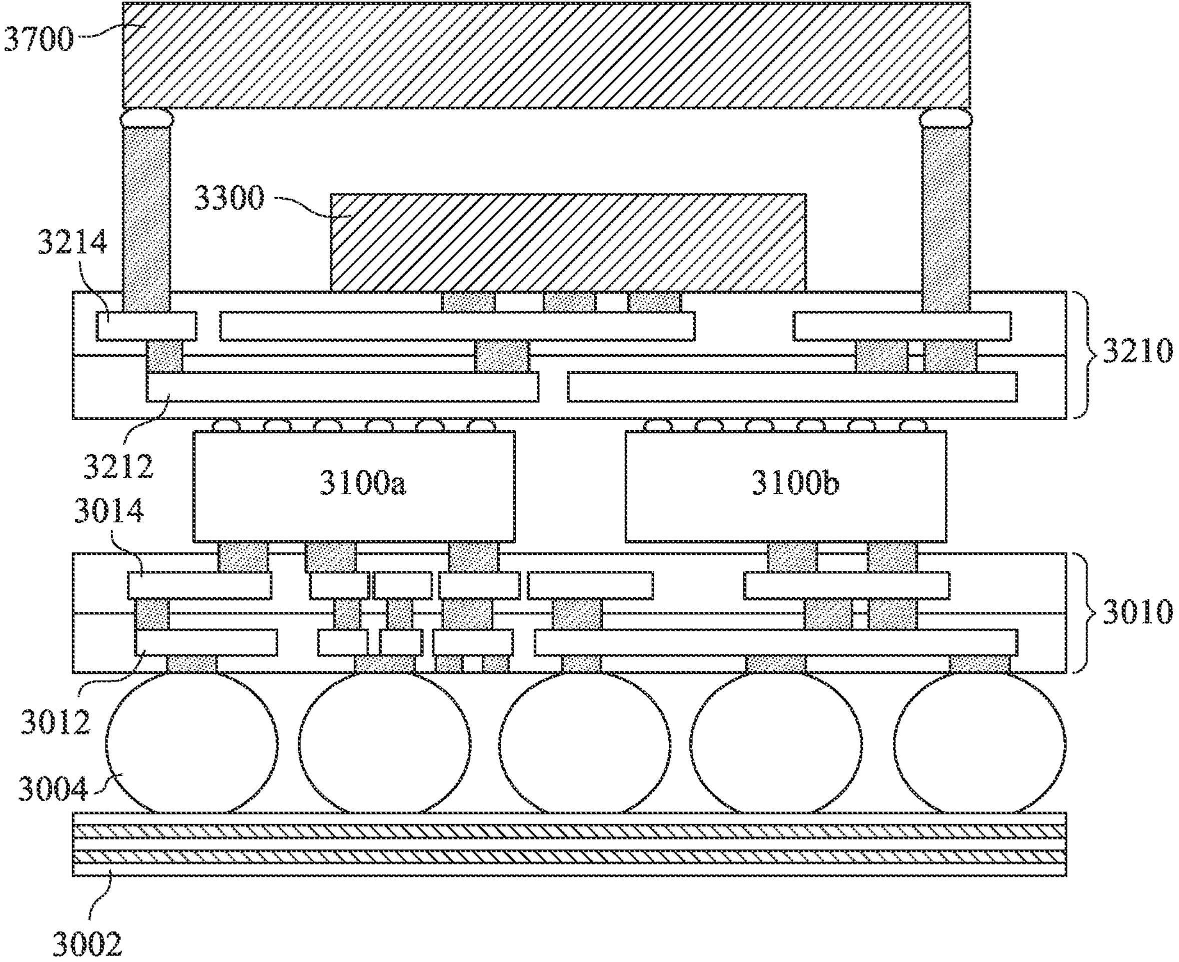
FIG. 3 illustrates a cross sectional view of another semiconductor device, in accordance with some embodiments.

Now referring to FIG. 3 an IPD 3100 may be disposed between two redistribution structures of a semiconductor device, instead of or in addition to between a substrate and a redistribution layer. In the depicted embodiment, a plurality of BGA balls 3004 join a substrate 3002 to a first redistribution structure 3010. Some embodiments may comprise different electrical terminals to join the substrate 3002 to the first redistribution structure 3010, in addition to or instead of the BGA balls 3004. The first redistribution structure 3010 may pass a plurality of signals, (e.g., supply, ground, I/O, etc.) between the substrate and a first IPD 3100*a* and a second IPD 3100*b*. For example, the first redistribution structure 3010 may comprise a first layer of conductive elements 3012 comprising a ground plane, a second layer of conductive elements 3014 comprising a power plane, and a plurality of vias or other electrical terminals connecting the first layer of conductive elements 3012, the second layer of conductive elements 3014, the BGA balls 3004, the first IPD 3100*a*, and the second IPD 3100*b*.

A second redistribution structure 3210 is disposed over the plurality of IPDs 3100. The second redistribution structure comprises a layer of third conductive elements 3212 and a layer of fourth conductive elements 3214, which are separated by an insulating layer comprising openings which may contain vias to selectively couple the third conductive elements to the fourth conductive elements. One or more such vias may also connect the third conductive elements to electrical terminals of the plurality of IPDs 3100, and to a semiconductor chip 3300, such that various signals (e.g., PDN signal or non-PDN signals) pass from or through the plurality of IPDs 3100, through the second redistribution structure 3210, and to the semiconductor chip 3300 disposed along an upper surface of the second redistribution layer 3210. Placing the IPDs 3100 proximate to the semiconductor die may better condition various signals connected to the semiconductor die, such as high speed transceiver signals, power and ground planes.

The depicted embodiment further comprises a plurality of TIVs which attach to the redistribution structure, as well as to a memory device 3700 disposed above the semiconductor chip 3300, such that the plurality of IPDs 3100, the semiconductor chip, and the memory device may all be connected, which may comprise similar or dissimilar interconnections as the memory device 270 and semiconductor chip 230 depicted in FIG. 2. Some embodiments comprise additional TIVs to pass signals between the first redistribution structure 3010 and the second redistribution structure 3210.

Figure 4:
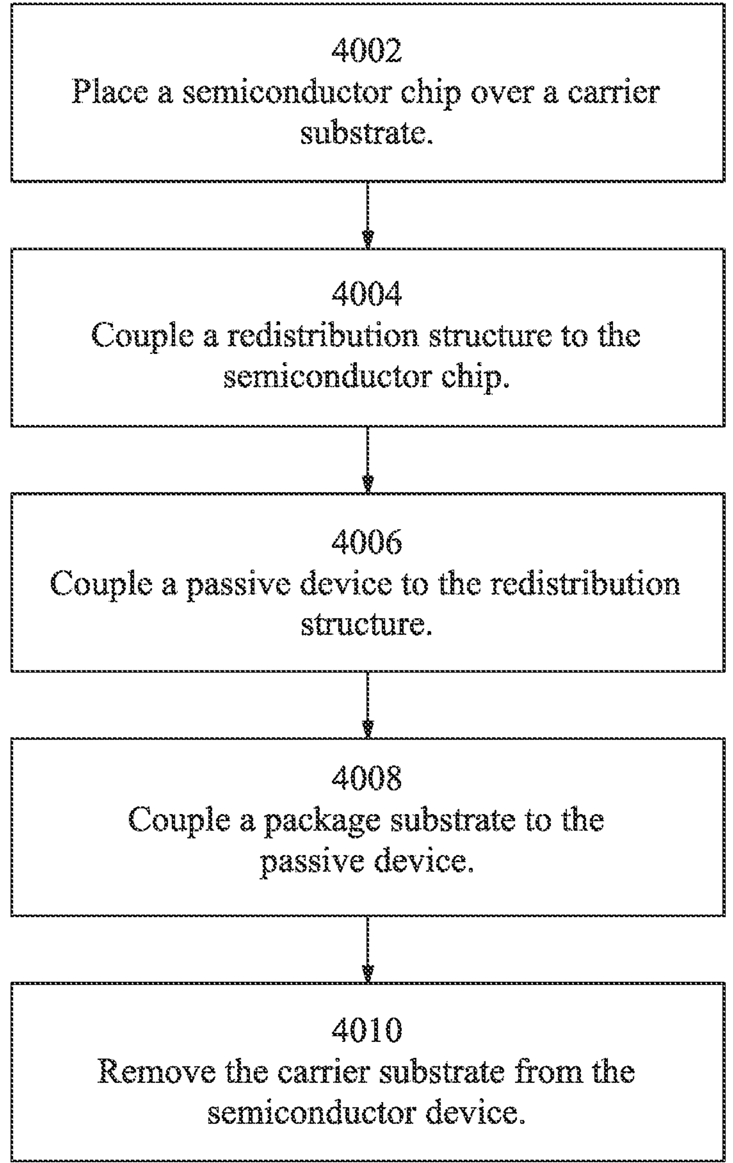
FIG. 4 includes a flowchart of an example method of fabricating a semiconductor device, in accordance with some embodiments.

FIG. 4 includes a flowchart of an example method of fabricating a semiconductor device, in accordance with some embodiments. For example, at least some of the operations described in the method 4000 may result in the semiconductor devices depicted in FIGS. 5A-5D. The disclosed method 4000 is disclosed as a non-limiting example, and additional operations may be provided before, during, and after the method 4000 of FIG. 4. Further, some operations may only be described briefly herein, however, one skilled in the art will understand that the disclosed operations may be performed in conjunction with other disclosed methods disclosed herein, or generally known in the art. For example, one skilled in the art will understand that the evacuation of particulate matter from the environment of operation may precede the disclosed process steps, absent any explicit disclosure. Further, the order of the disclosed operations is not intended to be limiting; certain operations may be performed in a different sequence, and still further operations may be sequenced with appropriate modifications thereto.

The method 4000 starts with operation 4002 wherein a first semiconductor chip is placed over a carrier substrate. The method 4000 proceeds to operation 4004 wherein a redistribution structure is coupled to the semiconductor die. At operation 4006, a passive device is coupled to the redistribution structure. At operation 4008, a package substrate is coupled to the passive device. Operation 4010 removes the carrier substrate from the semiconductor device.

Referring to operation 4002, the carrier substrate may be glass, ceramic, a polymer based material, or a combination of materials. For example, a de-bonding layer such as a die attach adhesive, or a light-to-heat conversion release layer may be deposited over a Borosilicate glass body, which may, advantageously, enable the carrier substrate to be removed from temporarily coupled layers while minimizing thermal expansion and contractions during subsequent processing steps. A semiconductor chip is placed over the carrier substrate, such as by the operation of a pick and place machine, and may comprise attaching the semiconductor chip to an intermediate layer such as an adhesive layer, or the de-bonding layer described above.

Referring to operation 4004, a redistribution structure comprising alternating layers of insulating material conductive elements is formed over the semiconductor die. For example, a first insulating layer is formed by molding, spin coating, deposition, CVD, PVD, or other processes known to those skilled in the art. The first insulating layer is selectively removed (e.g., via a patterning process using a photoresist, by mechanical drilling, laser ablation, etc.) to form a plurality of openings exposing conductive terminals which are attached to (or may be) metallization layers of the semiconductor chip. Metal is thereafter placed (e.g., by a plating process such as electro-plating, CVD, PVD, pouring, etc.) over the insulating layer, and within the openings of the first insulating layer, thereby forming connections between the semiconductor die, through the openings in the insulating layers, and to a first set of conductive elements disposed above the first insulating layer. Excess metal may thereafter be removed (e.g., by a selective etching process) to form a desired pattern of interconnections. If the thickness (i.e., z-height) of these interconnections exceeds a desired thickness, or a roughness of a surface exceeds a desired roughness, a planarization process such as CMP or CMG may plane the metal accordingly.

Alternatively, an insulating layer may be formed where the conductive elements of the layer are not desired, and thereafter the metal may be placed, which may obviate the removal (e.g., etching) of metal for a portion of a layer of conductive elements. Additional layers such as alternating layers of insulating layers and layers of conductive elements may be formed until a desired number of layers having a desired interconnection pattern is reached. Similar methods may be used to form various redistribution structures of other embodiments disclosed herein, redistribution structures of IPD's, etc.

Referring to operation 4006, a passive device (i.e., an IPD) is attached to a redistribution structure. For example, the passive device may be placed with a pick and place machine, placed over a solder mask, bumps, solder paste or other adhesive, etc., and may thereafter be exposed to heat (e.g., immediately following operation 4006). Operation 4006 may also comprise sub operations to adhere the second bumps of the IPD to the redistribution structure (or to the IPD), adhere the first IPD bumps to the IPD (or to the package substrate), or otherwise form connections between the IPD and the semiconductor device or the package substrate.

Referring to operation 4008, a package substrate is coupled to the IPD. The package substrate may comprise fan out connections from a bottom surface of the IPD, as well as other conductive terminals of the semiconductor device (e.g., TIVs, C4 bumps, etc.). In some embodiments, the package substrate may be formed over the IPD. In other embodiments, the package substrate may be prefabricated, and placed over the IPD. The package substrate may comprise (or may be configured to receive) conductive elements to attach the package substrate to a working substrate. For example, the packing substrate may comprise (or may be configured to receive) BGA balls, PGA pins, LGA lands, etc.

In 4010, the carrier substrate may be removed by any process known in the art, (e.g., with a tape adhesive or shearing force, mechanical or chemical grinding or polishing, by UV light (e.g., laser) irradiation of a de-bonding surface disposed along the redistribution structure, etc.).

FIGS. 5A, 5B, 5C, and 5D illustrate cross sectional views of intermediate stages in the formation of a semiconductor device, in accordance with some embodiments. Various elements of this disclosure may provide further detail as to the structure or manufacture of the provided diagram. As a non-limiting example, the method 4000 of FIG. 4 describes various process steps which may be used to realize the depicted embodiments.

Figure 5A:
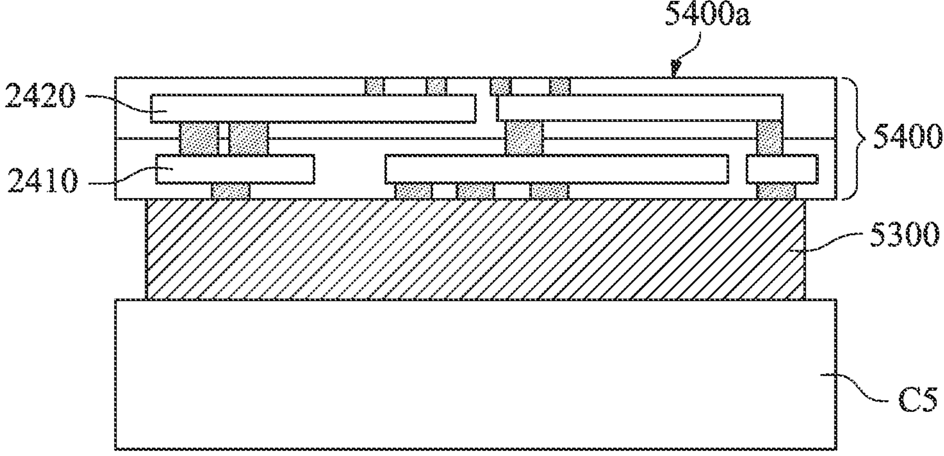
FIGS. 5A, 5B, 5C, and 5D illustrate cross sectional views of intermediate stages in the formation of a semiconductor device, in accordance with some embodiments.

FIG. 5A depicts a semiconductor chip 5300 placed over a carrier substrate, and a redistribution structure 5400 having a layer of first conductive elements 2410, and a layer of second conductive elements 2420, wherein each layer of conductive elements is disposed between two insulating layers having vias in openings thereof, such that conductive paths are formed between the semiconductor chip and a first surface of the redistribution structure 5400*a* opposite the carrier substrate C5.

Figure 5B:
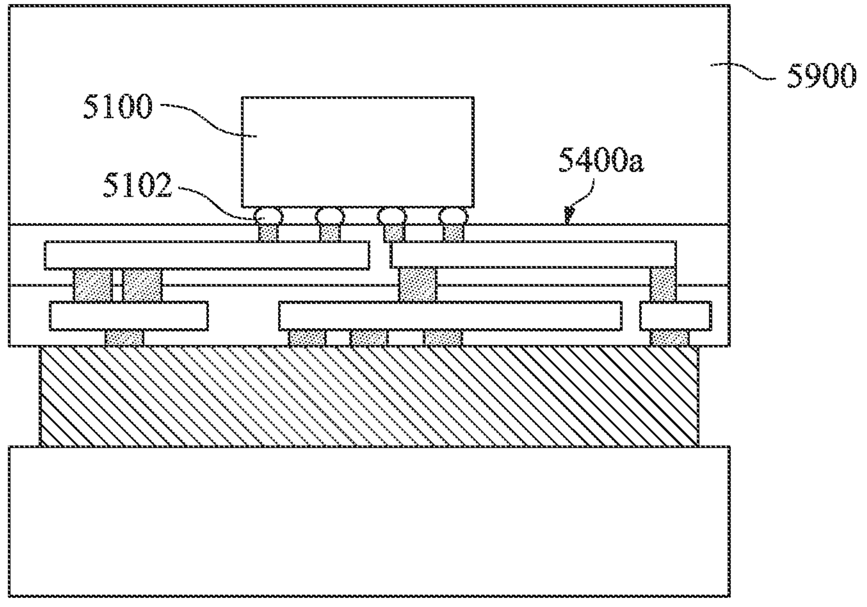

Referring now to FIG. 5B, an IPD is connected to the first surface of the redistribution structure 5400*a* by a second plurality of bumps 5102. A first encapsulant 5900 (e.g., comprising resins, polymers, other molding compounds, etc.) encapsulates the IPD 5100. As depicted in FIG. 5B, the encapsulant 5900 may cover a surface of the IPD 5100 opposite the first surface of the redistribution structure 5400*a*. Such a first encapsulant 5900 may be selectively removed to form additional electrical connections to the IPD (e.g., by grinding, cutting, polishing, selective etching, drilling, etc.). Alternatively or additionally, additional electrical connections may be made to the IPD prior to the application of the first encapsulant 5900.

Figure 5C:
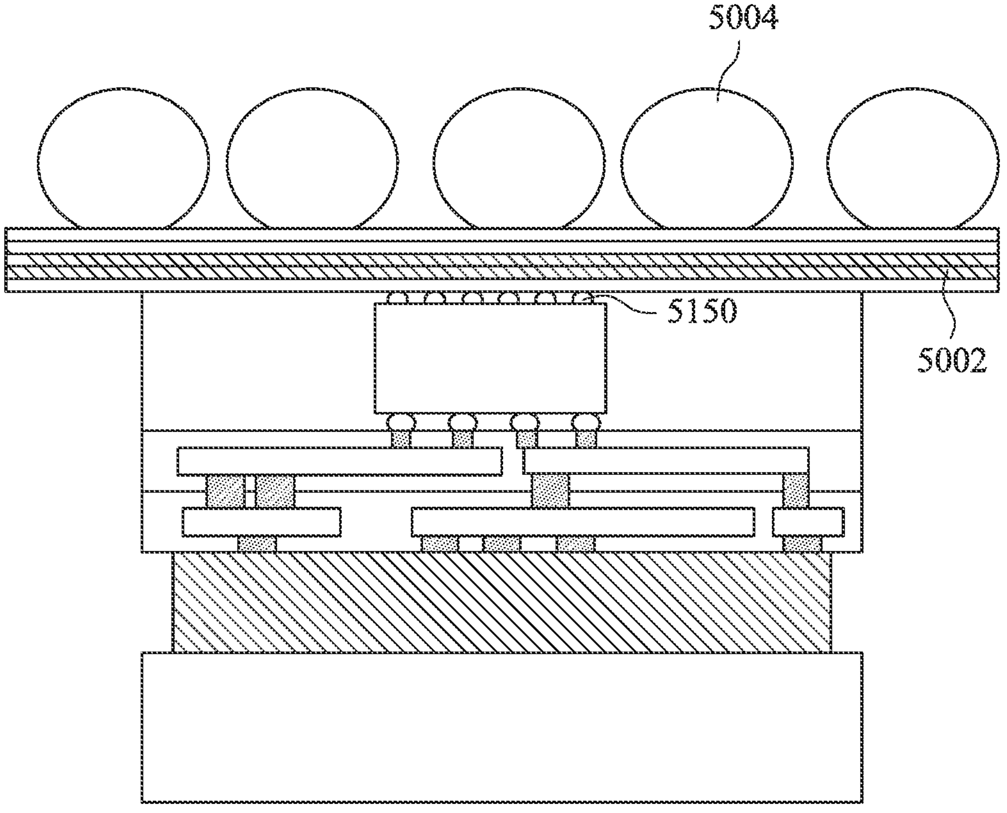
Figure 5D:
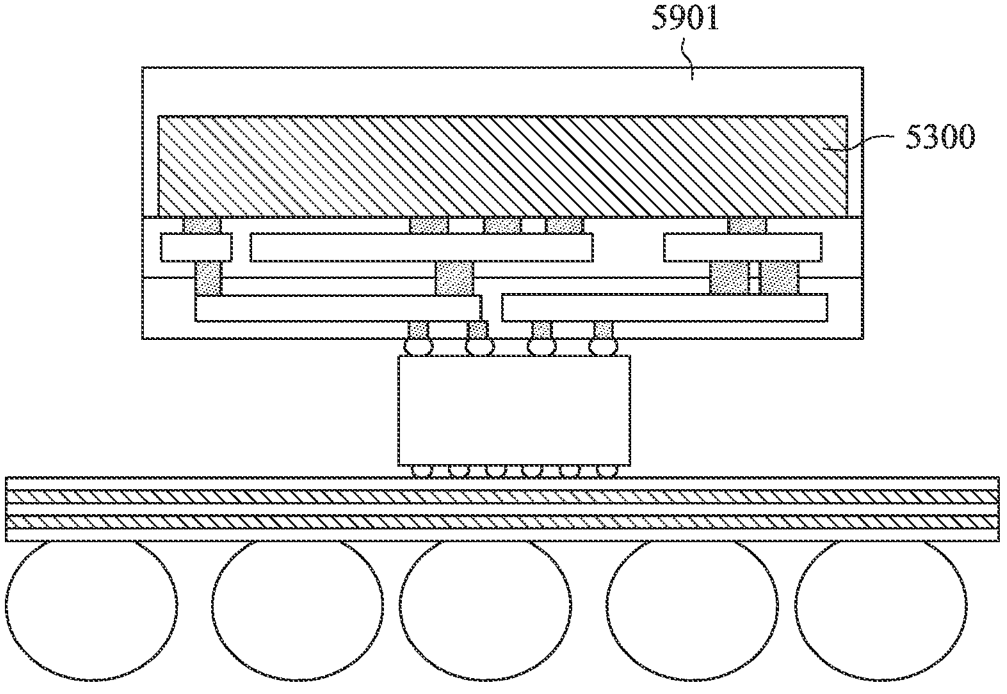

As depicted by FIG. 5C, additional electrical connections to the IPD are formed with a plurality of first bumps 5150, which, in turn, are adhered to a package substrate 5002, depicted having a plurality of BGA balls 5004 adhered thereto. FIG. 5D depicts the same semiconductor device wherein the carrier substrate has been removed, and a second encapsulant (e.g., a protectant) has been formed over the semiconductor chip.

In one aspect of the present disclosure, a semiconductor device is disclosed. The semiconductor device includes a redistribution structure, and a passive device disposed along a side of the redistribution structure, the passive device having a first plurality of bumps disposed along a first side and a second plurality of bumps disposed along a second side, opposite the first side, and the semiconductor device having a third plurality of bumps which are spaced laterally from the first passive device.

In another aspect of the present disclosure, a semiconductor device is disclosed. The semiconductor device includes a passive device physically and electrically connected to a package substrate through a plurality of first bumps, and to a redistribution structure through a plurality of second bumps, and wherein a semiconductor chip is disposed over the redistribution structure.

In yet another aspect of the present disclosure, a method for fabricating a semiconductor device is disclosed. The method includes placing a semiconductor chip over a carrier substrate, coupling a redistribution structure to the semiconductor device, coupling a passive device to the redistribution structure opposite the semiconductor chip, coupling a package substrate to the passive device through a plurality of second bumps, and removing the carrier substrate.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a redistribution structure having a first side and a second side opposite to each other;

a first passive device disposed on the first side of the redistribution structure, wherein the first passive device comprises a plurality of first bumps and a plurality of second bumps disposed on a first side and a second side of the first passive device, respectively; and a plurality of third bumps laterally spaced from the first passive device, wherein the plurality of third bumps and the plurality of second bumps are configured to couple the semiconductor device with a package substrate at a coplanar surface of the package substrate, wherein the first passive device is configured to receive a power signal from the package substrate at the first bumps and provide a filtered instance of the power signal to a circuit disposed on the second side of the first passive device via the second bumps.

2. The semiconductor device of claim 1, wherein at least some of the plurality of third bumps surround the first passive device.

3. The semiconductor device of claim 1, further comprising the package substrate, wherein the first passive device is coupled to the package substrate through the plurality of second bumps.

4. The semiconductor device of claim 3, further comprising a first semiconductor chip disposed on the second side of the redistribution structure.

5. The semiconductor device of claim 4, wherein at least some heat generated by the first semiconductor chip is dissipated through the redistribution structure and then the pluralities of first and second bumps of the first passive device, and to the package substrate.

6. The semiconductor device of claim 4, further comprising a second semiconductor chip disposed over a first side of the first semiconductor chip opposite to a second side of the first semiconductor chip that faces the redistribution structure.

7. The semiconductor device of claim 6, wherein the second semiconductor chip includes a memory device.

8. The semiconductor device of claim 1, further comprising a second passive device laterally adjacent the first passive device.

9. The semiconductor device of claim 8, wherein the second passive device comprises the plurality of third bumps and a plurality of fourth bumps disposed on a first side and a second side of the second passive device, respectively.

10. The semiconductor device of claim 8, wherein the first and second passive devices each comprise:

a substrate; and a plurality of through via structures extending through the substrate, wherein the plurality of through via structures are each configured to electrically couple at least one of the first bumps to at least one of the second bumps.

11. The semiconductor device of claim 10, wherein at least one of the plurality of through via structures is configured to deliver a supply voltage.

12. A semiconductor device, comprising:

a package substrate;

a passive device physically and electrically coupled to the package substrate through a plurality of first bumps;

a redistribution structure disposed over the passive device, wherein the passive device is physically and electrically coupled to the redistribution structure through a plurality of second bumps; and a first semiconductor chip disposed over the redistribution structure, wherein the passive device is configured to receive a power signal from the package substrate at the first bumps and provide a filtered instance of the power signal to the semiconductor chip via the second bumps.

13. The semiconductor device of claim 12, wherein at least some heat generated by the first semiconductor chip is dissipated through the redistribution structure and then the pluralities of first and second bumps, and to the package substrate.

14. The semiconductor device of claim 12, wherein the first bumps have a first diameter and the second bumps have a second diameter, and wherein the first diameter is substantially greater than the second diameter.

15. The semiconductor device of claim 12, wherein the passive device has at least a portion vertically overlapped with a portion of the first semiconductor chip.

16. The semiconductor device of claim 12, further comprising a second semiconductor chip disposed over the first semiconductor chip and electrically coupled to the redistribution structure, wherein the second semiconductor chip includes a memory device.

17. The semiconductor device of claim 12, wherein the passive device has a first area and the first semiconductor chip has a second area, and wherein the first area is substantially similar to the second area.

18. The semiconductor device of claim 1, wherein any semiconductor chips of the semiconductor device are disposed on a second side of the redistribution structure.

19. The semiconductor device of claim 12, wherein any semiconductor chips of the semiconductor device are disposed on a second side of the redistribution structure.

20. The semiconductor device of claim 12, wherein the package substrate comprises a printed circuit board.

* * * * *